United States Patent [19]

Noblett et al.

[11] Patent Number: 5,444,312

[45] Date of Patent: Aug. 22, 1995

[54] SOFT SWITCHING CIRCUIT FOR AUDIO MUTING OR FILTER ACTIVATION

[75] Inventors: Ronald D. Noblett, Sugarland; Kurtis J. Bowman, Cypress, both of Tex.

[73] Assignee: Compaq Computer Corp., Houston, Tex.

[21] Appl. No.: 878,443

[22] Filed: May 4, 1992

[51] Int. Cl.⁶ ............................................. H04B 15/00
[52] U.S. Cl. .................................. 327/552; 381/94; 327/311; 327/384
[58] Field of Search ............... 307/263, 520, 521, 542, 307/543, 549, 550, 554, 556, 568; 381/94, 104, 110, 120

[56] References Cited

U.S. PATENT DOCUMENTS

| | | | |
|---|---|---|---|
| 3,252,001 | 11/1961 | Thompson et al. | 328/149 |
| 3,573,641 | 4/1967 | Zenk | 307/542 |
| 4,363,004 | 12/1982 | Englund, Jr. et al. | 307/521 |
| 4,617,481 | 10/1986 | Masuda | 328/127 |
| 4,695,742 | 9/1987 | Randall | 307/271 |
| 4,721,870 | 1/1988 | Rector et al. | 307/521 |
| 4,746,814 | 5/1988 | Shigekane | 307/570 |
| 4,849,663 | 7/1989 | Kunze et al. | 307/521 |
| 5,130,579 | 7/1992 | Thomas | 307/543 |
| 5,151,942 | 9/1992 | Sasaki | 381/94 |

OTHER PUBLICATIONS

Sedra & Smith, "Micro-Electronics Circuits", (1982), at 34 and 306-310.

*Primary Examiner*—R. Skudy
*Assistant Examiner*—Shawn Riley
*Attorney, Agent, or Firm*—Pravel, Hewitt, Kimball & Krieger

[57] ABSTRACT

A soft switching circuit gradually connects an audio signal to zero reference level to mute the audio signal, or connect a filter to enable the filter. A MOSFET is connected between the audio signal and the zero reference level. A resistor-capacitor circuit is connected to the gate of the MOSFET and receives the MUTE or FILTER* signal from the computer system. When the MUTE or FILTER* signal changes condition, the RC circuit provides a signal to the MOSFET gate that changes relatively gradually. Consequently, the drain-to-source resistance of the MOSFET also changes from short circuit to open circuit or vice versa relatively gradually.

11 Claims, 3 Drawing Sheets

SOFT SWITCHING CIRCUIT FOR AUDIO MUTING OR FILTER ACTIVATION

BACKGROUND OF THE INVENTION

1. Field of the Invention

The invention generally relates to computer audio systems, and more particularly, to a soft switching circuit which gradually connects or disconnects the audio signal to or from another voltage level when a signal is asserted.

2. Description of Related Art

In modern personal computer systems, several devices provide interfaces between the computer system and the human user. Among these devices are systems and equipment designed to allow the user to direct the computer's operations and to provide the user with information regarding the computer's results and status. In particular, many personal computers and applications employ sound to generate warnings or convey information to the user.

Generally, sound is produced by transducers connected to the computer. Amplifier circuitry amplifies audio signals generated by the computer system to provide sufficient current to drive the transducers. To generate and control the audio signals, the computer systems include audio control circuitry, which receives inputs from several sources, including control signals indicating which audio signals should be transmitted to the amplifiers.

Audio systems often include a mute signal for disabling the audio output when audio functions are unnecessary or undesirable. In addition, many audio systems include filter circuits that may be activated and deactivated by the microprocessor to remove unwanted noise. Several methods are available for muting the audio system or activating the filter. Although the complexity of these systems varies, perhaps the simplest and most effective method of muting the audio signal is to simply ground the audio signal before it is provided to the amplifier. Normally, this can be achieved by providing relays between the audio signal outputs and ground. If the relays are deactivated, the audio signal is isolated from ground and drives the amplifier. When the relays are activated by the mute signal, however, the audio signal is short-circuited to ground and the amplifiers are rendered inactive.

Similarly, relays may be used to bypass or activate a stage of a filter. For example, a low pass filter and a band elimination filter may be connected to the audio signal. To bypass the band elimination filter, the node between the filters may be connected to a relay which is also connected to ground. When the relay is deactivated, both filters process the audio signal. When the relay is activated, however, the band elimination filter is bypassed so that only the low pass filter processes the signal.

At the time the audio signal is muted, any signal asserted at the audio input immediately drops to zero. Similarly, when the filter is activated or deactivated, the relay connection to ground causes a sudden variation in the filter circuit impedance, causing a variation in the audio signal voltage. In either case, the sudden change in voltage is amplified, like any other signal, and transmitted to the transducer. The rapid voltage change of the audio signal causes the amplifier to generate an unpleasant pop or snap.

This effect is particularly unpleasant for certain systems that consistently maintain a direct current (DC) offset voltage. Although a DC offset voltage develops at the audio signal outputs, it does not affect the audio signal, as the transducers only react to alternating current (AC) signals and the amplifiers may be AC coupled. If a DC offset voltage is present when the mute signal or the filter signal is activated, however, the connection of the relay to ground causes an immediate change of voltage in the audio system, generating the unpleasant pop from the transducer. As a result, every time the mute signal or the filter signal is asserted, the audio system generates the annoying pop, regardless of whether an audio signal was being transmitted at the time.

SUMMARY OF THE INVENTION

The present system provides a soft switching circuit that gradually connects the audio signal to ground or connects a filter to the audio signal. The circuit includes a metal-oxide-silicon field effect transistor (MOSFET) having its drain and source connected to the audio signal output and the zero reference level, respectively, and is controlled by the MOSFET's gate-to-source voltage. When the gate-to-source voltage reaches its saturation point, the drain-to-source resistance of the MOSFET is minimal, completing a virtual short circuit between the audio signal and the zero reference level. When the gate-to-source voltage is zero, on the other hand, the drain-to-source resistance of the transistor becomes extremely high relative to the resistance of the audio system, creating a virtual open circuit. When the MOSFET's gate-to-source voltage is between the extremes of zero and the saturation point, the drain-to-source resistance of the transistor varies continuously with respect to the gate-to-source voltage.

To control the drain-to-source resistance, the MOSFET gate is connected to a resistor-capacitor (RC) circuit. The RC circuit is connected to the gate of the MOSFET and receives the mute or filter signal. When the mute or filter signal changes condition, the RC circuit provides a signal at the gate of the MOSFET. Although the mute signal switches from HIGH to LOW or vice versa very quickly, the RC circuit output provided to the MOSFET gate changes relatively gradually. Consequently, the drain-to-source resistance of the MOSFET also changes from a short circuit to an open circuit, or vice versa, relatively gradually. Because the connection is gradual, and because the rate of the voltage change is therefore comparatively small, the effect on the transducer becomes negligible, eliminating the unpleasant pop or snap caused by an immediate switch.

BRIEF DESCRIPTION OF THE DRAWINGS

A better understanding of the invention can be obtained when the description of the preferred embodiments is considered in conjunction with the following drawings, in which.

DETAILED DESCRIPTION OF THE PREFERRED EMBODIMENTS

Figure 1:
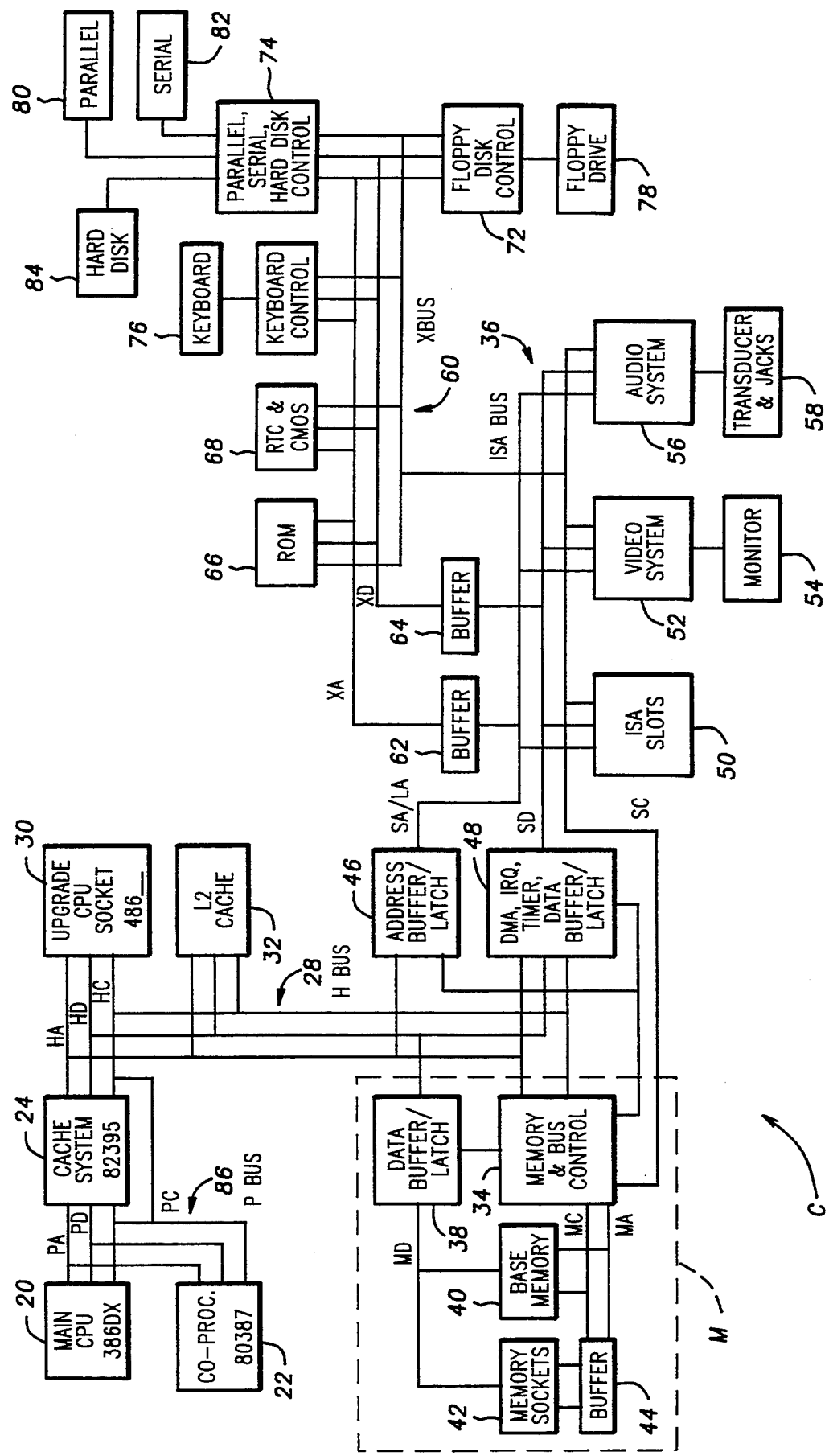
FIG. 1 is a block diagram of a computer incorporating the present invention.

Referring now to FIG. 1, the letter C designates generally a computer system incorporating the present invention. System C is comprised of a number of block elements interconnected via four buses. Throughout this specification, signal mnemonics with an asterisk following the signal mnemonic indicates that the signal may be active at a logic low level and always is the inverse of a signal mnemonic without the asterisk. Signal mnemonics having numbers or ranges between angle brackets refer to those particular bits or positions in a bus.

A main CPU 20 is connected to a numeric coprocessor 22 and to a cache system 24. A bus, generally referred to as the P or processor bus 26 is used to connect the main CPU 20, the numeric coprocessor 22 and the cache system 24. Preferably the main CPU 20 is an Intel Corporation 80386 DX-25 microprocessor, while the numeric coprocessor is an 80387 and the cache system 24 is an 82395 cache controller.

A second or H or host bus 28 is used to connect the cache system 24 to various other elements in the computer system C. For example, an upgrade CPU socket 30 is provided to receive various processors of the 486 family developed by Intel. In addition, a level 2 or secondary cache 32 is also connected to the host bus 28 for operation. It is understood that the various buses such as the P bus 26 and the host bus 28 are generally comprised of three portions: an address portion, a data portion, and a control portion, such as the PA, PD and PC buses or the HA, HD and HC buses.

In the preferred embodiment a combined memory and bus controller 34 is connected to the host bus 28 to provide control of the memory utilized in the computer system C and to develop control signals for a third bus, the ISA bus 36. Describing now the memory portion M of the computer system C, the memory and bus controller 34 provides control signals to a data buffer/latch unit 38 which is connected to the HD bus. A memory data or MD bus is provided from the data buffer/latch 38 to base memory 40 and to memory sockets 42. Preferably the base memory 40 is developed by using a plurality of dynamic random access memories (DRAMs) which are soldered to the main circuit board of the computer system C. The memory sockets 42 are preferably designed to receive single in-line memory modules (SIMMs). The memory and bus controller 34 provides the memory control MC and memory address MA signals to the base memory 40 and to buffers 44, which are in turn connected to the memory sockets 42.

As noted above, the memory and bus controller 34 helps develop control signals for SC portion of the ISA bus 36. In addition, the memory and bus controller 34 is connected to an address buffer/latch 46 which is connected between the HA bus and develops the SA/LA address bus portion as utilized in the ISA bus 36. The memory and bus controller 34 is also connected to a combined unit system peripheral 48 which includes a DMA controller, an interrupt controller, timers and a data buffer/latch 48. The data buffer/latch portion of the combined unit 48 is to the host data or HD bus and provides the SD or data bus portion of the ISA bus 36.

Referring now to the ISA bus 36, a plurality of ISA slots 50 are provided directly off the ISA bus 36 as conventional in personal computer systems. A video system 52 is connected to the ISA bus 36, with a monitor 54 connected to the video system 52 to provide a graphic output for the computer system C. Additionally, an audio system 56 is connected to the ISA bus 36, with an internal transducer 58 and jacks for supplemental amplifiers and transducers connected to the audio system 56. More detail on the audio system 56 is provided below.

Developed from the ISA bus 36 is the fourth or remaining bus referred to as the X bus 60. A buffer 62 is provided between the SA/LA bus to develop the XA address bus while a buffer 64 is provided between the SD bus and an XD bus. The SC control lines are used directly to control the X bus 60. Various internal components in the computer system C are connected to the X bus 60. For example, the read only memory (ROM) 66 containing the BIOS of the computer system C is connected to the X bus 60, as are the real time clock (RTC) and CMOS memory 68, a keyboard controller 70, a floppy disk controller 72 and a multiple peripheral controller 74. The keyboard controller 70 is connected to a keyboard and a mouse system 76 to provide user input, while the floppy disk controller 72 is connected to a floppy disk drive 78. The multiple peripheral controller 74 contains a parallel port which is connected to a parallel interface 80, a serial port which is connected to a serial interface 82 and a hard disk interface which is connected to a hard disk unit 84.

The computer system C shown in FIG. 1 is exemplary of a computer system incorporating the present invention and numerous other variations could of course be developed as obvious to one skilled in the art. For example, the memory and bus controller 34 could be reorganized into several discrete units which perform equivalent functions. In a like manner, the DMA-/interrupt/timer and data buffer combined unit 48 could also be divided up into individual components to perform equivalent functions.

Figure 2:
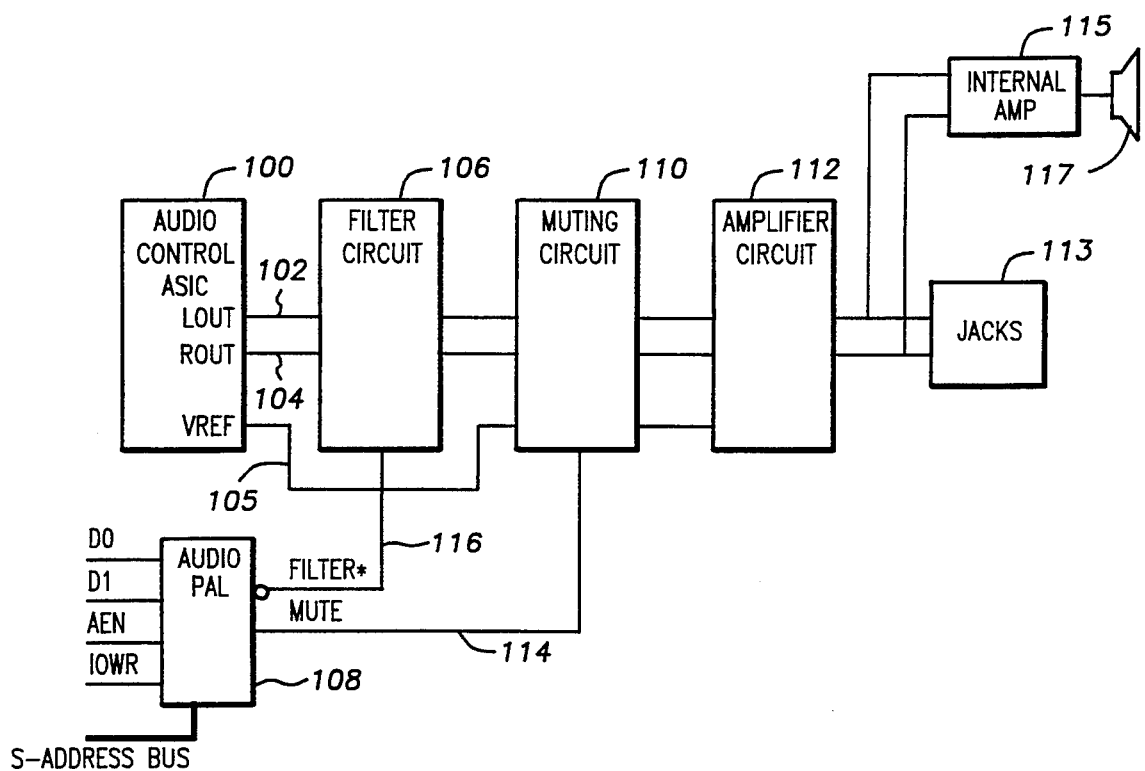
FIG. 2 is a block diagram of portions of the audio system and speaker of the system shown in FIG. 1.

Referring now to FIG. 2, audio signals for the system are generated by an audio control application specific integrated circuit (ASIC) 100. Various sources supply audio data to the audio control ASIC 100, including the microprocessor 20 and various auxiliary inputs, and the microprocessor 20 provides control signals. Generally, the audio control ASIC 100 receives digital data at its inputs which is converted to analog audio data and receives analog audio signals which are converted to digital audio data. Control signals generated by the microprocessor 20 activate the audio system 56 and indicate whether A/D, D/A or both modes are activated and which inputs should be used to generate the audio signals. A pair of audio control ASIC 100 outputs generate the analog audio signals LOUT 102 and ROUT 104. In some modes of the operation the LOUT and ROUT audio signals 102 and 104 have a small DC offset or bias from a zero reference level, which if switched rapidly to ground could result in undesirable pops and snaps.

Signals transmitted by the audio control ASIC 100 are provided to a filter circuit 106 designed to remove unwanted signals from the audio output signals 102, 104. The filter circuit 106 has two stages, one of which always processes the audio signals, and a second stage that can be bypassed. In some applications, the second stage is undesirable or unnecessary. Consequently, the filter 106 may be activated and deactivated by the microprocessor 20 through an audio control programmable array logic (PAL) device 108, hereinafter referred to as the audio PAL, which is described in detail below.

Following the filter circuit 106, the output signals LOUT 102 and ROUT 104 are provided to a muting circuit 110, which is controlled by the microprocessor 20 through the audio PAL 108. When the muting circuit 110 is deactivated, the audio signals LOUT 102 and ROUT 104 are transmitted by the muting circuit 110 without modification. When the microprocessor 20 activates the muting circuit 110, however, the muting circuit 110 disables the LOUT and ROUT signals 102, 104, thus cancelling the system's audio function.

When the muting circuit 110 is deactivated, the audio signals LOUT 102 and ROUT 104 are amplified by an amplification circuit 112 to provide enough current to properly drive conventional line level audio outputs. A zero level reference voltage, preferably 2.25 V DC, is provided on a VREF signal 105 is used in the amplifier circuit 112 and the muting circuit 110, which is not the same as the ground reference voltage used in the filter circuit 106. The VREF signal 105 is used as the audio control ASIC 100 and the amplifying circuit 112 are preferably operating from a single voltage supply such as 5 volts, so an offset is needed to allow development of sinusoidal audio signals. This VREF signal 105 thus forms the zero reference level for the audio signals LOUT and ROUT 102 and 104.

After amplification, the signals LOUT 102 and ROUT 104 are provided to the audio jacks 113 and to an internal amplifier 115. The internal amplifier 115 drives an internal speaker or transducer 117. Generally, the transducer 117 is a cone speaker of a type well known in the field.

As indicated above, the filter circuit 106 and the muting circuit 110 of the present system are controlled by the audio PAL 108. MUTE signal 114 and FILTER* or the inverse of the FILTER signal 116 are generated by the audio PAL 108 according to signals received from the computer system C and its programming. To control the audio PAL 108, the computer system C supplies signals to the audio PAL 108 through the SA bus, two data I/O signals D0 and D1, the AEN (Address Enable) signal, and the IOWR signal. The SA bus is used by the microprocessor 20 to address commands to the audio PAL 108. The data I/O signals are generated by the microprocessor 20 to individually activate the filter signal 116 or the muting signal 114. To indicate that the address on the address bus is valid, the AEN signal is asserted, and the asserted IOWR signal indicates that the I/O data signals are valid and being written.

When the audio PAL 108 is addressed, the PAL 108 functions according to the following equations:

$$MUTE = (\overline{AEN} \cdot D1 \cdot IOWR) + (MUTE \cdot \overline{(\overline{AEN} \cdot \overline{D1} \cdot IOWR)})$$

$$FILTER^* = (\overline{AEN} \cdot D0 \cdot IOWR) + (FILTER^* \cdot \overline{(\overline{AEN} \cdot \overline{D0} \cdot IOWR)})$$

Thus, the MUTE signal 114 is asserted when the I/O data signal D1 has a value of 1, the IOWR signal is asserted HIGH, and the AEN signal is asserted LOW. To latch the MUTE signal 114, the second term holds the MUTE signal 114 HIGH until the IOWR signal is asserted HIGH and the AEN signal is asserted LOW while the I/O data signal D1 has a value of 0. The MUTE signal 114 stays low until the first term is again met.

Similarly, the FILTER, signal 116 is asserted HIGH when the I/O data signal D0 has a value of 1, the IOWR signal is asserted HIGH, and the AEN signal is asserted LOW. To latch the FILTER, signal 116 HIGH, the second term of the PAL equation holds the FILTER, signal 116 HIGH until the IOWR signal is asserted HIGH and the AEN signal is asserted LOW while the I/O data signal D0 has a value of 0. The FILTER, signal stays LOW until the first term is again met. Thus, when the appropriate conditions are satisfied, the audio PAL 108 generates the MUTE signal 114 and the FILTER* signal 116.

Figure 3:
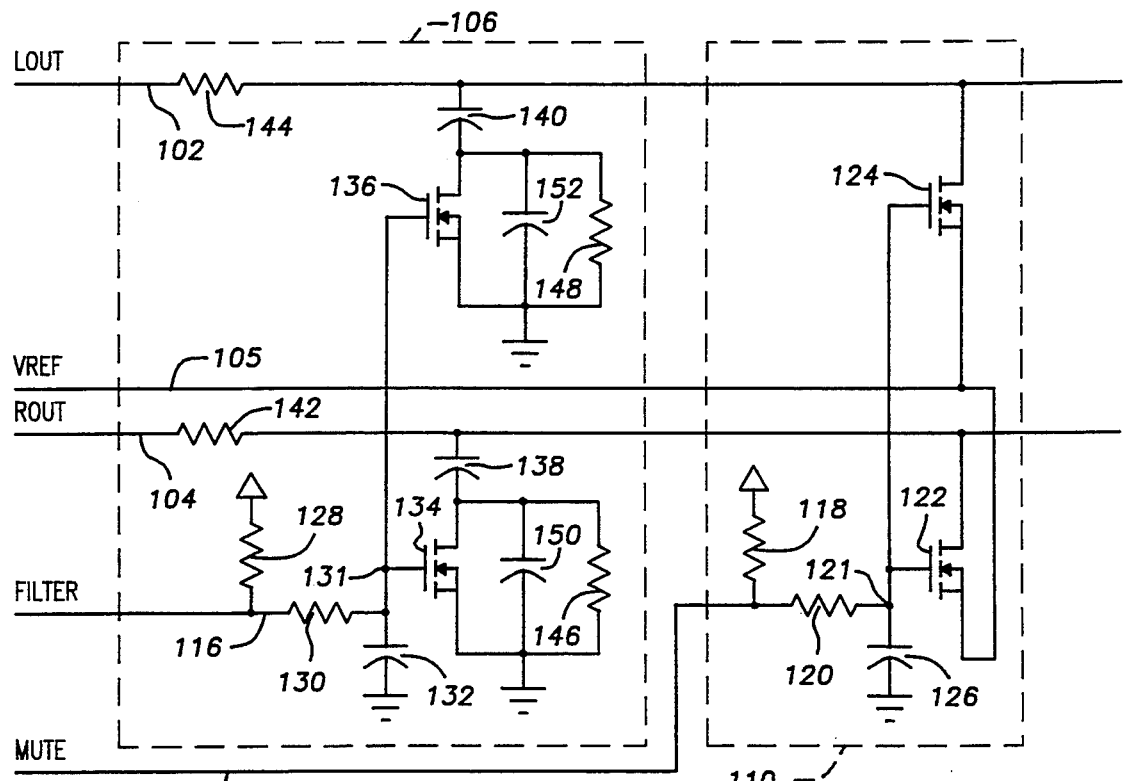
FIG. 3 is a circuit diagram of a first embodiment of the filter circuit and the muting circuit shown in FIG. 2.

Referring now to FIG. 3, the MUTE signal 114 controls the operation of the muting circuit 110. A pull-up resistor 118 is connected to the MUTE signal 114 on the audio PAL 108 to hold the MUTE signal 114 at a full 5 volt logic level HIGH unless the audio PAL 108 drives the MUTE signal 114 to logic level LOW. The MUTE output 114 of the audio PAL 108 is further connected to the first terminal of a resistor 120 having its second terminal connected to the gates of a pair of n-channel enhancement MOSFETs 122, 124. The second terminal of the resistor is also connected to a terminal of a capacitor 126, and the capacitor's 126 other terminal is connected to the computer system's true ground reference. The resistor 120 and capacitor 126 combination form an RC circuit so that sudden changes in the voltage of the MUTE signal 114 result in relatively slow changes in voltage at the junction 121 of the resistor 120 terminal, the capacitor 126 terminal, and the MOSFET 122, 124 gates. The exact rate of the voltage change produced by a variation in the MUTE signal 114 voltage is dependent upon the resistance of the resistor 120 and the capacitance of the capacitor 126. Preferred values for the resistor 120 and the capacitor 126 are 100 kΩ and 0.047 μF.

Figure 4:
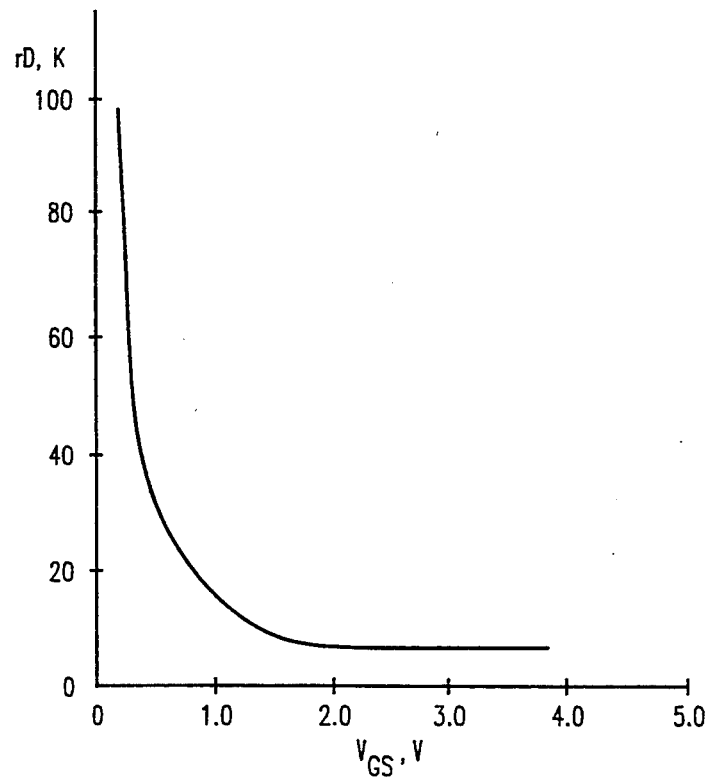
FIG. 4 is a graph indicating the drain-to-source resistance of a MOSFET as a function of the MOSFET's gate-to-source voltage.

The drain of each MOSFET 122, 124 is connected to one of the audio signals 102, 104. The source of each MOSFET 122, 124, on the other hand, is connected to the zero reference level or VREF signal 105 of the system. When each MOSFET's 122, 124 gate-to-source voltage reaches its saturation point, the drain-to-source resistance of each MOSFET 122, 124 is negligible. Conversely, when the gate-to-source voltage of the MOSFET 122, 124 is zero, the drain-to-source resistance of each MOSFET 122, 124 greatly increases so that the drain-to-source current through the MOSFET 122, 124 becomes negligible. When the gate-to-source voltage of either MOSFET 122, 124 is between the saturation voltage and zero extremes, the MOSFETs 122, 124 exhibit variable drain-to-source resistance corresponding to the gate-to-source voltage. To illustrate this voltage variable characteristic, FIG. 4 illustrates the drain-to-source resistance of a MOSFET with respect to the gate-to-source voltage. As indicated in FIG. 4, the drain-to-source resistance of the MOSFET decreases continuously as the gate-to-source voltage increases to the saturation point.

When the present system's MUTE signal 114 is asserted LOW, the change of the MUTE signal 114 from logic level HIGH to LOW is relatively instantaneous. The change from HIGH to LOW at the junction 121, however, changes more slowly, depending upon the resistance and capacitance values of the RC circuit 120, 126. As the voltage at the junction 121 gradually and continuously drops, the gate-to-source voltage varies accordingly. Consequently, the gradual variation of the gate-to-source voltage of the MOSFETs 122, 124 causes the drain-to-source resistance of the MOSFETs 122, 124 to also vary gradually. Thus, the resistance between the audio signals LOUT and ROUT 102, 104 and the zero reference level changes from a nearly open circuit to having negligible resistance relatively gradually and continuously as the gate-to-source voltage increases. Consequently, the pop or snap caused by a sudden voltage change is eliminated.

Similarly, a pair of MOSFET circuits control the filter circuit 106 operations. The FILTER* output 116 of the audio PAL 108 is connected to a pull-up resistor 128 to hold the FILTER* signal 116 at a full 5 volt HIGH level when the filter circuit 106 is activated. In addition, the FILTER* signal 116 is connected to a terminal of a resistor 130, the resister 130 having its other terminal connected to a capacitor 132. Like the RC circuit of the muting circuit 110, the other terminal of the capacitor 132 is connected to ground, and the junction 131 of the resistor 130 and the capacitor 132 is connected to the gates of a pair of MOSFETs 134, 136.

Because the filter circuit 106 includes two filter stages, the drain of each MOSFET 134, 136 is connected to a capacitor 138, 140 that provides a connection to the first stage. The source of each MOSFET 134, 136 is connected to ground. The first stage of the filter circuit comprises a pair of resistors 142, 144 connected to the audio outputs LOUT and ROUT 102, 104 of the audio control ASIC 100. Each resistor's 142, 144 other terminal is connected to one of the capacitor 138, 140 terminals, the junctions of which provide the filter circuit's output. This resistor-capacitor combination is the first stage of the filter, providing a general low pass filter having a cutoff frequency determined by the resistor 142, 144 and capacitor 138, 140 values. Exemplary values are 7.5 k$\Omega$ and 0.022 $\mu$F.

The second stage of the filter 106 includes a resistor 146, 148 and may include a capacitor 150, 152 connected in parallel between the drain and the source of each MOSFET 134, 136. If the MOSFET 134, 136 is deactivated, the second stage is coupled to the audio signal LOUT and ROUT 102,104 and processes the audio signal 102, 104 according to the values of the resistor 146, 148 and capacitor 150, 152 components, which are preferably 150 k$\Omega$ and 0.01 $\mu$F. If the MOSFET 134, 136 is activated, however, the first stage capacitor 138, 140 is gradually connected directly to ground and the second stage is bypassed. It should be noted that the audio signals LOUT and ROUT 102, 104 are connected to ground only with respect to AC signals; the DC component of the audio signal LOUT and ROUT 102, 104 remains isolated from ground due to the first stage capacitor 138, 140.

Thus, when the FILTER* signal 116 is logic level HIGH and the MOSFETs 134, 136 are activated, the second filter stages are bypassed. When the FILTER* signal 116 is logic level LOW, on the other hand, the MOSFETs 134, 136 are gradually deactivated and the second filter stages become active. The RC circuits connected to the MOSFET 134, 136 gates receive the FILTER* signal 116, causing the MOSFETs' 134, 136 gate-to-source voltages to change relatively gradually. As the gate-to-source voltage gradually changes, the drain-to-source resistance of the MOSFET 134, 136 gradually changes accordingly, preventing the transmission of a sudden voltage change to the amplifiers and transducers 58 upon assertion of the FILTER* signal 116.

The presence of the resistors 142 and 144 also allow the muting circuit 110 to connect the LOUT and ROUT audio signals 102 and 104 to ground without damage to the outputs of the audio control ASIC 100.

Figure 5:
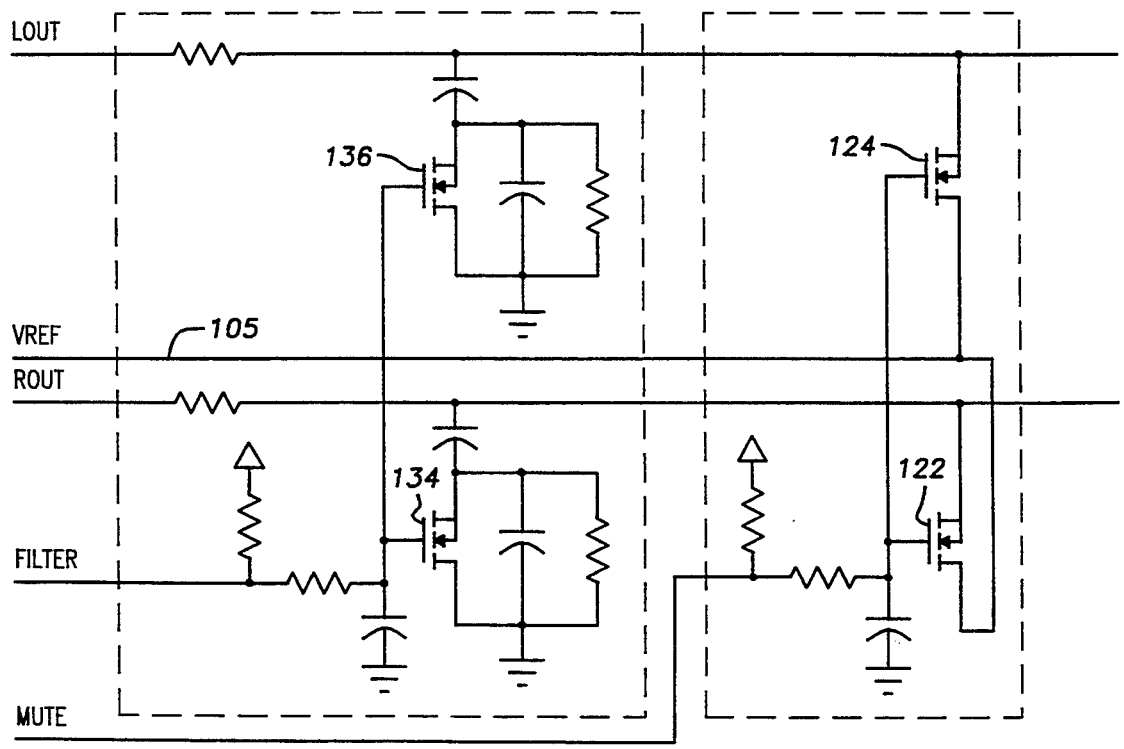
FIG. 5 is a circuit diagram of an alternative embodiment of the filter circuit and the muting circuit shown in FIG. 2.

It should be noted that each MOSFET's 122, 124, 134, 136 drain and source connections to the audio signals 102, 104 and the zero reference level or ground, respectively, may be exchanged, so that the MOSFET's 122, 124, 134, 136 drain is connected to the zero reference level or ground and the source is connected to the audio signal 102, 104, as shown in FIG. 5. In either arrangement, the muting circuit 110 and filter circuit 106 operate essentially the same.

The above disclosure and description of the invention are illustrative and explanatory thereof, and various changes in size, shape, materials, components, circuit elements, wiring connections and contacts, as well as in the details of the illustrated circuitry and construction, may be made without departing from the spirit of the invention.

We claim:

1. An audio signal switching circuit, comprising:
   a reference voltage;
   an audio signal having a direct current offset relative to said reference voltage; and
   means connected to said reference voltage and said audio signal for gradually providing a substantially short circuit connection between said reference voltage and said audio signal wherein said short circuit means progressively changes a resistance between said audio signal and said reference voltage.

2. The muting circuit of claim 1, wherein said short circuit means includes a transistor having a first terminal connected to said audio signal and a second terminal connected to said reference voltage.

3. The muting circuit of claim 2, wherein said transistor further includes a third terminal, and wherein said short circuit means further comprises a gradual voltage change circuit having an output connected to said third terminal of said transistor, wherein said gradual voltage change circuit output provides a gradually changing voltage signal to said third terminal and wherein the resistance between said transistor first and second terminals varies inversely based on the voltage applied to said third terminal, so that said transistor resistance changes gradually in response to said gradually changing voltage signal.

4. The muting circuit of claim 3, wherein said gradual voltage change circuit includes a resistor connected to said third terminal of said transistor and a capacitor having a first terminal connected to said resistor and said third terminal of said transistor and having a second terminal connected to said reference voltage.

5. A soft filter circuit for smoothly changing filter characteristics when a filter signal is asserted, the filter circuit being connected to a signal output and a ground reference, the filter circuit comprising:
   a resistor having one terminal connected to the output signal and providing the filter circuit output at its second terminal;
   a capacitor having one terminal connected to said resistor second terminal;
   means responsive to the filter signal for providing a relatively gradually changing signal when the filter signal is asserted and deasserted;

a variable resistor responsive to the gradually changing signal and connected between the second terminal of said capacitor and the ground reference so that the resistance of said variable resistor gradually decreases when said filter signal is asserted and gradually increases when said filter signal is deasserted; and a second filter means connected in parallel with said variable resistor.

6. The circuit of claim 5, wherein said variable resistor is a transistor.

7. The circuit of claim 6, wherein said transistor is a MOSFET having a drain connected to the signal output, a source connected to the second voltage, and a gate connected to said gradually signal.

8. The circuit of claim 6, wherein said transistor is a MOSFET having a source connected to the signal output, a drain connected to the ground reference, and a gate connected to said gradually signal.

9. The circuit of claim 5, wherein said gradually changing signal means includes:
   a resistor having a first terminal connected to the filter signal and having a second terminal connected to said variable resistor; and
   a capacitor having a first terminal connected to said second terminal of said resistor and said variable resistor and having a second terminal connected to the second voltage.

10. A circuit for connecting a signal output to a reference voltage when a connection signal is asserted, comprising:
   a resistor having a first terminal and a second terminal, said first terminal being connected to the connection signal;
   a capacitor having a first terminal connected to said second terminal of said resistor and having a second terminal connected to a ground signal, wherein said resistor and said capacitor provide a gradually changing signal in response to the connection signal; and
   a MOSFET responsive to said gradually changing signal having a drain connected to the signal output, a source connected to the reference voltage, and a gate connected to said second terminal of said resistor and said first terminal of said capacitor, wherein the resistance between said drain and said source decreases gradually when the connection signal is asserted and increases gradually when the connection signal is deasserted.

11. A circuit for connecting a signal output to a reference voltage when a connection signal is asserted, comprising:
   a resistor having a first terminal and a second terminal, said first terminal being connected to the connection signal;
   a capacitor having a first terminal connected to said second terminal of said resistor and having a second terminal connected to a ground signal, wherein said resistor and said capacitor provide a gradually changing signal in response to the connection signal; and
   a MOSFET responsive to said gradually changing signal having a source connected to the signal output, a drain connected to the reference voltage, and a gate connected to said second terminal of said resistor and said first terminal of said capacitor, wherein the resistance between said drain and said source decreases gradually when the connection signal is asserted and increases gradually when the connection signal is deasserted.

* * * * *